United States Patent
Pollard

(10) Patent No.: US 9,021,699 B2
(45) Date of Patent: May 5, 2015

(54) REMOVING PIEZOELECTRIC MATERIAL USING ELECTROMAGNETIC RADIATION

(75) Inventor: Jeffrey R. Pollard, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 951 days.

(21) Appl. No.: 13/061,722

(22) PCT Filed: Sep. 23, 2008

(86) PCT No.: PCT/US2008/077308
§ 371 (c)(1),
(2), (4) Date: Mar. 2, 2011

(87) PCT Pub. No.: WO2010/036235
PCT Pub. Date: Apr. 1, 2010

(65) Prior Publication Data
US 2011/0168807 A1    Jul. 14, 2011

(51) Int. Cl.
| | | |
|---|---|---|
| B21D 53/76 | (2006.01) | |
| B23P 17/00 | (2006.01) | |
| H01L 41/22 | (2013.01) | |
| H04R 17/00 | (2006.01) | |
| B41J 2/15 | (2006.01) | |
| B41J 2/145 | (2006.01) | |
| B41J 2/135 | (2006.01) | |
| H01L 41/338 | (2013.01) | |
| B23K 26/06 | (2014.01) | |
| B23K 26/08 | (2014.01) | |
| B23K 26/36 | (2014.01) | |
| B23K 26/40 | (2014.01) | |

(Continued)

(52) U.S. Cl.
CPC .............. H01L 41/338 (2013.01); Y10T 29/42
(2015.01); B23K 26/063 (2013.01); B23K 26/0807 (2013.01); B23K 26/367 (2013.01); B23K 26/407 (2013.01); B23K 26/409 (2013.01); B23K 2201/40 (2013.01); B41J 2/1607 (2013.01); B41J 2/1623 (2013.01); B41J 2/1632 (2013.01); B41J 2/1634 (2013.01); H01L 41/313 (2013.01)

(58) Field of Classification Search
CPC ...... B41J 2/1603; B41J 2/1626; B41J 2/1631; B41J 2/1623; H01L 41/39
USPC .................... 29/890.1, 25.35; 347/40, 44, 45
See application file for complete search history.

(56) References Cited

U.S. PATENT DOCUMENTS

| | | | | |
|---|---|---|---|---|
| 4,328,410 | A | * | 5/1982 | Slivinsky et al. ........ 219/121.69 |
| 4,897,903 | A | * | 2/1990 | Johannsen .................... 29/25.35 |

(Continued)

FOREIGN PATENT DOCUMENTS

| | | |
|---|---|---|
| CN | 101244651 | 8/2008 |
| EP | 1842678 A1 | 10/2007 |

(Continued)

OTHER PUBLICATIONS

Supplementary European Search Report for Application No. EP 08823247.5. Report issued Aug. 13, 2012.

*Primary Examiner* — David Angwin
(74) *Attorney, Agent, or Firm* — Hewlett-Packard Patent Department

(57) ABSTRACT

Electromagnetic radiation is transmitted through a piezoelectric material and is absorbed in at least an adhesive that bonds the piezoelectric material to another material. Absorbing the electromagnetic radiation in the adhesive ablates the adhesive and the ablation of the adhesive acts to remove the piezoelectric material.

7 Claims, 9 Drawing Sheets

(51) Int. Cl.
*B41J 2/16* (2006.01)
*H01L 41/313* (2013.01)

(56) References Cited

U.S. PATENT DOCUMENTS

| | | | | |
|---|---|---|---|---|
| 5,505,364 | A * | 4/1996 | Plesinger | 228/121 |
| 5,535,494 | A * | 7/1996 | Plesinger et al. | 29/25.35 |
| 5,731,048 | A * | 3/1998 | Ashe et al. | 427/585 |
| 6,188,416 | B1 * | 2/2001 | Hayes | 347/71 |
| 6,291,088 | B1 * | 9/2001 | Wong et al. | 428/698 |
| 6,416,158 | B1 * | 7/2002 | Floyd et al. | 347/21 |
| 6,658,737 | B2 * | 12/2003 | Shigemura | 29/890.1 |
| 2007/0046153 | A1 * | 3/2007 | Matsuda et al. | 310/358 |

FOREIGN PATENT DOCUMENTS

| | | |
|---|---|---|
| EP | 1958777 A2 | 8/2008 |
| JP | 1991-073348 | 3/1991 |
| JP | 2002-144547 | 5/2002 |
| JP | 2006-344618 | 12/2006 |
| JP | 2007-275884 | 10/2007 |
| JP | 2007-296777 | 11/2007 |
| JP | 2008-049569 | 3/2008 |
| JP | 2008-198959 | 8/2008 |

* cited by examiner

REMOVING PIEZOELECTRIC MATERIAL USING ELECTROMAGNETIC RADIATION

BACKGROUND

Piezoelectric materials, such as crystals, ceramics, formulations of lead, magnesium, and niobate (PMN), formulations of lead, zirconate, and titanate (PZT), or the like, produce a stress and/or strain when an electric field is applied thereto. As such, piezoelectric materials are often used as actuators for imparting forces to materials or objects that they are in contact with. For example, piezoelectric materials are often used to impart forces to deflect materials they are in contact with.

In one example, one or more piezoelectric actuators may form part of a fluid-ejection device, such as a print-head. For this implementation, piezoelectric actuators are formed overlying a deflectable-layer, e.g., a conductive layer, such as a ground layer, overlying a glass-layer. The deflectable-layer is formed overlying a semiconductor substrate, e.g., of silicon, having channels, such as ink-delivery channels, formed therein such that a piezoelectric actuator corresponds to each channel. During operation, a selected actuator imparts a force to the deflectable-layer in response to an electric field being applied to the actuator. The force imparted to the deflectable-layer deflects the deflectable-layer, causing a drop of fluid, such as ink, to be ejected from the channel corresponding to the selected actuator.

In conventional fabrication methods, the piezoelectric actuators are typically formed by using an adhesive to bond a layer of piezoelectric material to the deflectable-layer. The layer of piezoelectric material is then cut into segments, e.g., using a saw or other similar mechanical cutting tool, so that each segment forms a piezoelectric actuator. To avoid destroying the deflectable-layer by contacting the deflectable-layer with the saw, the depth of each saw cut extends to within a certain distance, e.g., about 5 to about 15 microns, from the deflectable-layer. However, this can leave piezoelectric material and adhesive at the end of each saw cut that extends between neighboring actuators.

The piezoelectric material that extends between neighboring actuators can produce cross-talk between the neighboring actuators. For example, when an electric field is applied to one of the actuators, the neighboring actuators may also respond. This can adversely affect the timing and the impact velocity of the ejected drops, which can adversely affect print quality.

Another problem associated with leaving piezoelectric material and adhesive at the end of each saw cut is that the piezoelectric material and adhesive acts to reduce the compliance of the deflectable-layer. Therefore, the electric field applied to the actuators may need to be increased to properly deflect the deflectable-layer. However, increased electric fields act to increase degradation of piezoelectric materials and thus acts to reduce the life of the actuators.

DETAILED DESCRIPTION

In the following detailed description of the present embodiments, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The following detailed description is, therefore, not to be taken in a limiting sense, and the scope of the claimed subject matter is defined only by the appended claims and equivalents thereof.

Figure 1A:
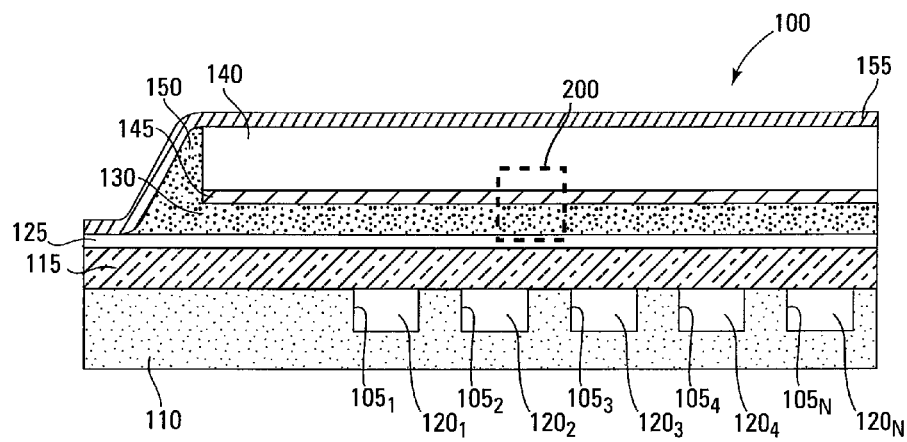
FIGS. 1A-1C are cross-sectional views of a portion of a fluid-ejection device during various stages of fabrication, according to an embodiment of the disclosure.
Figure 1B:
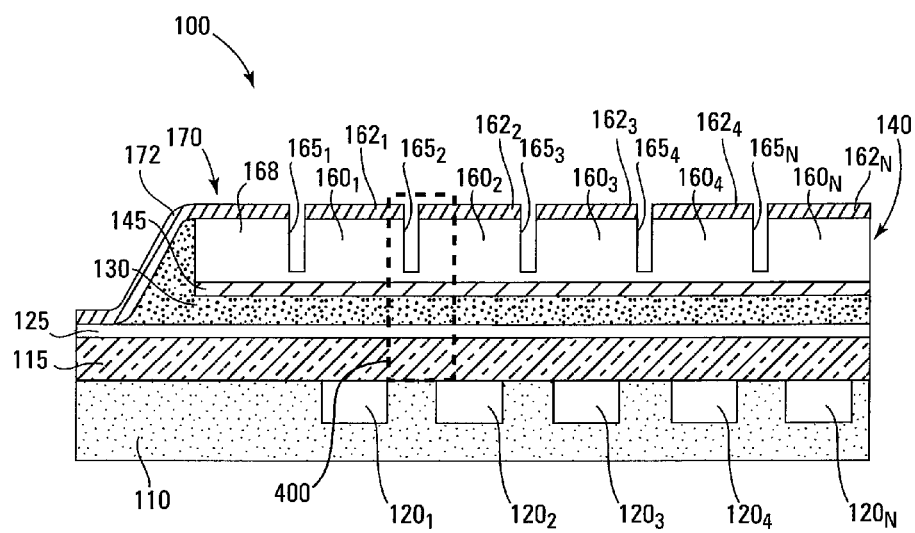
Figure 1C:
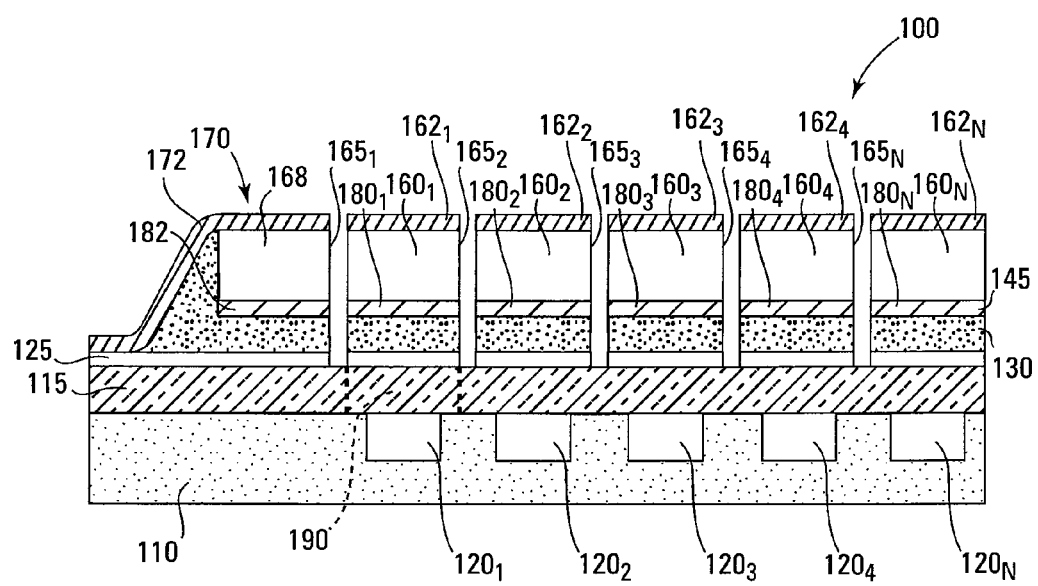

FIGS. 1A-1C are cross-sectional views of a fluid-ejection device, such as a print-head 100, during various stages of fabrication, according to an embodiment. FIG. 1A illustrates print-head 100 after several fabrication steps have been performed. In general, the structure of FIG. 1A is formed by forming trenches $105_1$ to $105_N$ that extend into a substrate, such as a semiconductor substrate 110 e.g., of silicon or the like, below an upper surface of semiconductor substrate 110. For example, trenches 105 may be formed by forming a mask layer (not shown) overlying semiconductor substrate 110, patterning the mask layer to designate portions of semiconductor substrate 110, corresponding to trenches 105, for removal, removing the designated portions of semiconductor substrate 110, e.g., by etching, to form trenches 105, and removing the mask layer.

For one embodiment, a dielectric layer, such as glass layer 115 is formed overlying and in contact with the upper surface of semiconductor substrate 110 in order to close trenches 105 to form fluid-delivery channels $120_1$ to $120_N$, such as ink-delivery channels. For example, semiconductor substrate 110 forms a bottom-wall and sidewalls of each channel 120, and a lower surface of glass layer 115 forms an upper wall of the channels 120. For one embodiment, glass layer 115 may be secured to semiconductor substrate 110, e.g., by plasma-enhanced bonding, vacuum bonding, anodic bonding, or the like.

A conductive layer, e.g., a ground layer 125 for one embodiment, is subsequently formed overlying and in contact with an upper surface of glass layer 115. For one embodiment, ground layer 125 is a layer of indium-tin oxide. For one embodiment, a conductive coating 145, e.g., of metal, such as nickel, is applied to a lower surface of a layer of piezoelectric material 140, such as a piezoelectric crystal, a piezoelectric ceramic, a formulation of lead, magnesium, and niobate (PMN), a formulation of lead, zirconate, and titanate (PZT), or the like. After forming ground layer 125, an adhesive 130 (e.g., in the form of a layer), such as epoxy, is applied to an upper surface of ground layer 125 and/or to conductive coating 145 to bond conductive coating 145 and thus the layer of piezoelectric material 140 to ground layer 125, where conductive coating 145 is interposed between adhesive 130 and the layer of piezoelectric material 140. For one embodiment, adhesive 130 is an electrical insulator.

For another embodiment, additional adhesive 130 may be applied between the layer of piezoelectric material 140 and ground layer 125 adjacent an end of the layer of piezoelectric material 140 for forming a fillet 150 of adhesive 130. For example, for one embodiment, when adhesive 130 is squeezed between conductive coating 145 and ground layer 125, the additional adhesive 130 is squeezed from between conductive coating 145 and ground layer 125 to form fillet 150. For one embodiment, conductive coating 145 is vacuum bonded to ground layer 125, e.g., to eliminate air bubbles, to create a thin bond-line of adhesive 130, etc., and the additional adhesive 130 is drawn from between conductive coating 145 and ground layer 125 to form fillet 150.

Figure 2:
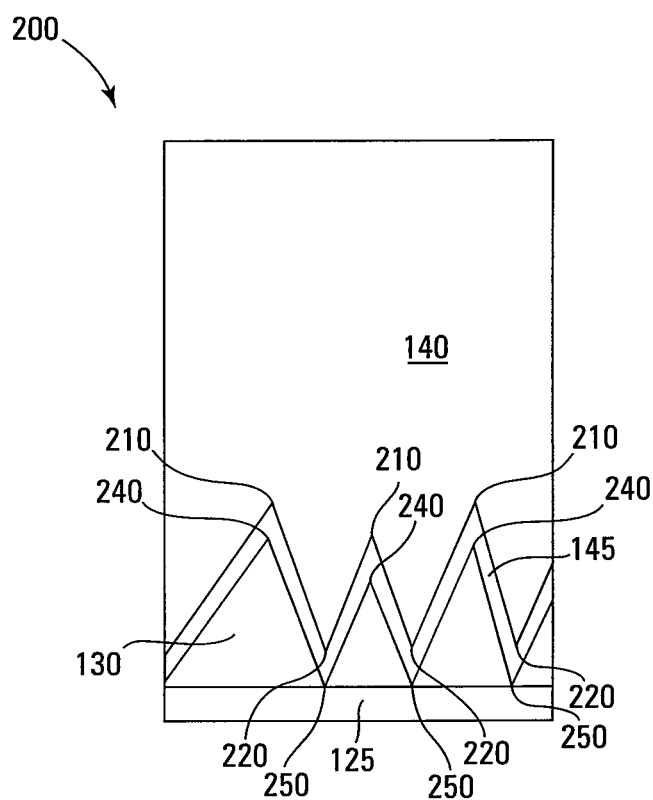
FIG. 2 is an enlarged view of the region 200 of FIG. 1A, according to another embodiment of the disclosure.

Note that the lower surface of the layer of piezoelectric material 140 may be rough and may include peaks 210 and valleys 220, as shown in FIG. 2, an enlarged view of the region 200 of FIG. 1A. Therefore, the conductive coating 145 formed on the peaks 210 and valleys 220 of the lower surface of the layer of piezoelectric material 140 has a rough surface with peaks 240 and valleys 250. Therefore, when the adhesive 130 is applied to the upper surface of ground layer 125 and/or to conductive coating 145 and is squeezed between ground layer 125 and conductive coating 145 some of valleys 250 of conductive coating 145 may contact ground layer 125, as shown in FIG. 2, thereby electrically coupling conductive coating 145 to ground layer 125.

For one embodiment, after the layer of piezoelectric material 140 is bonded to ground layer 125, a conductive layer 155 is formed overlying and in contact with an upper surface of the layer of piezoelectric material 140, an upper surface fillet 150, and a portion of ground layer 125, as shown in FIG. 1A. For another embodiment, conductive layer 155 may be a metal layer, having at least one of a gold layer, a chromium layer, and a nickel layer. For one embodiment, conductive layer 155 includes a chromium layer formed overlying and in contact with the upper surface of the layer of piezoelectric material 140, a nickel layer overlying and in contact with the chromium layer, and a gold layer overlying and in contact with the nickel layer.

After forming conductive layer 155, the layer of piezoelectric material 140 and conductive layer 155 are divided into portions (e.g., segments) in FIG. 1B. Dividing the layer of piezoelectric material 140 into segments forms piezoelectric actuators $160_1$ to $160_N$, from piezoelectric material 140, respectively directly overlying channels $120_1$ to $120_N$. For example, actuators $160_1$ to $160_N$ are directly aligned with channels $120_1$ to $120_N$ on a one-to-one basis. Segmenting conductive layer 155 forms upper conductors $162_1$ to $162_N$, from conductive layer 155, respectively of actuators $160_1$ to $160_N$, where conductors $162_1$ to $162_N$ respectively overlie and are in contact with the upper surfaces of actuators $160_1$ to $160_N$. That is, conductors $162_1$ to $162_N$ correspond to actuators $160_1$ to $160_N$ on a one-to-one basis.

For one embodiment, the layer of piezoelectric material 140 and conductive layer 155 are divided into segments mechanically using a mechanical cutting tool, such as a saw or the like, to form slots 165, e.g., cuts, to separate the segments of the layer of piezoelectric material 140, corresponding to actuators 160, from each other and to separate the segments of conductive layer 155, corresponding to conductors 162, from each other.

For another embodiment, slot $165_1$ separates a portion of the layer of piezoelectric material 140 corresponding to actuator $160_1$ from a portion 168 of the layer of piezoelectric material 140 corresponding to a portion of an electrode, such as ground electrode 170, as shown in FIG. 2. For example, ground electrode 170 includes the portion 168 of the layer of piezoelectric material 140 and an upper conductor 172 (a portion of conductive layer 155) in contact with the upper surface of the portion 168 and electrically coupled to ground layer 125. For one embodiment, a ground contact (not shown) may be electrically coupled to ground electrode 170 for coupling ground layer 125 to ground.

Figure 3A:
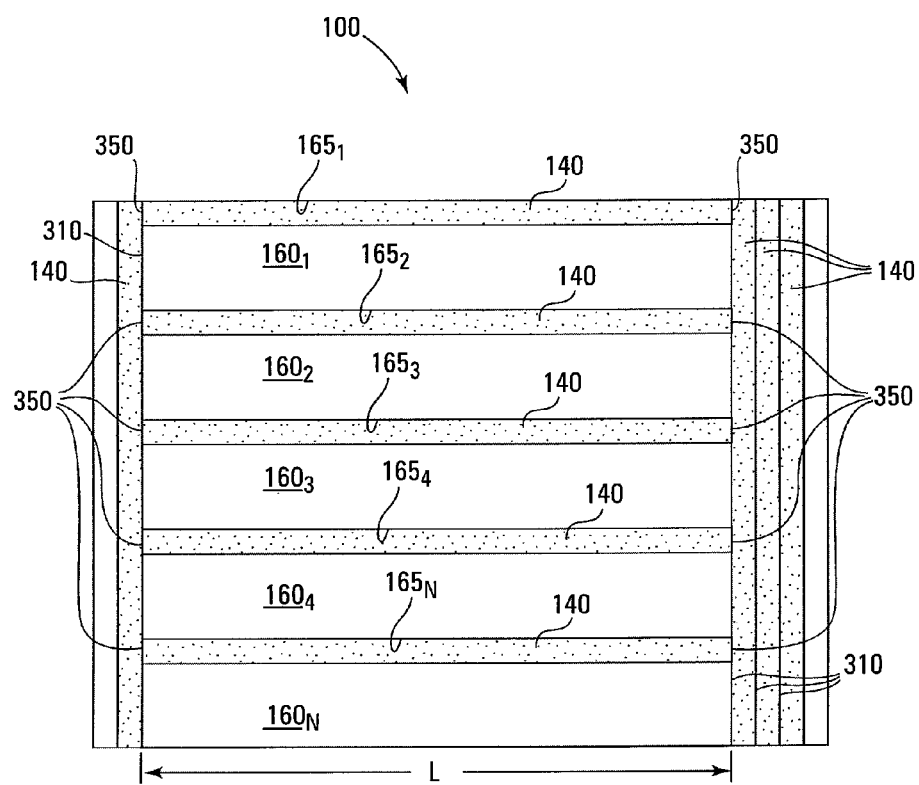
FIG. 3A is a top view of a portion of the fluid-ejection device at the stage of fabrication shown in FIG. 1B, according to another embodiment of the disclosure.

For one embodiment, each of slots 165 terminates within the layer of piezoelectric material 140, as shown in FIG. 1B, e.g., to prevent the saw from cutting into or through, and thereby destroying, ground layer 125. For another embodiment, e.g., after forming slots 165, slots 310, e.g., cuts, are formed at either end 350 of each of slots 165 substantially perpendicularly to slots 165 using the saw or the like, as shown in FIG. 3A, a top view of a portion of print-head 100 at the stage of fabrication shown in FIG. 1B. For one embodiment, slots 310 are formed to substantially the same depth as slots 165. For example, each of slots 310 terminates within the layer of piezoelectric material 140. Note that the stippled portions within slots 165 and 310 in FIG. 3A represent piezoelectric material 140 at the bottom of each of slots 165 and 310.

For another embodiment, after mechanically forming slots 165 using a saw or the like, slots 165 are extended in FIG. 1C to expose portions of the upper surface of ground layer 125. This is accomplished by removing, using a beam of electromagnetic radiation, at least a portion of the piezoelectric material 140 at the bottom of each of slots 165 that is connected between neighboring actuators 160, the portion of conductive coating 145 underlying the piezoelectric material 140 at the bottom of each of slots 165, the portion of adhesive 130 underlying the portion of conductive coating 145, and the portion of the ground layer 125 underlying the portion of adhesive 130 to expose a portion of the upper surface of glass layer 115, as indicated by the absence of the stippled portions within slots 165 in FIG. 3B, a top view of a portion of printhead 100 at the stage of fabrication shown in FIG. 1C.

The removal process forms lower conductors $180_1$ to $180_N$, from conductive coating 145, respectively of actuators $160_1$ to $160_N$, where conductors $180_1$ to $180_N$ respectively underlie and are in contact with the lower surfaces of actuators $160_1$ to $160_N$, as shown in FIG. 1C. That is, conductors $180_1$ to $180_N$ correspond to actuators $160_1$ to $160_N$ on a one-to-one basis. Note that each actuator 160 is sandwiched between an upper conductor 162 and a lower conductor 180, as shown in FIG. 1C. The removal process also forms a lower conductor 182, from conductive coating 145, of ground electrode 170.

Figure 3B:
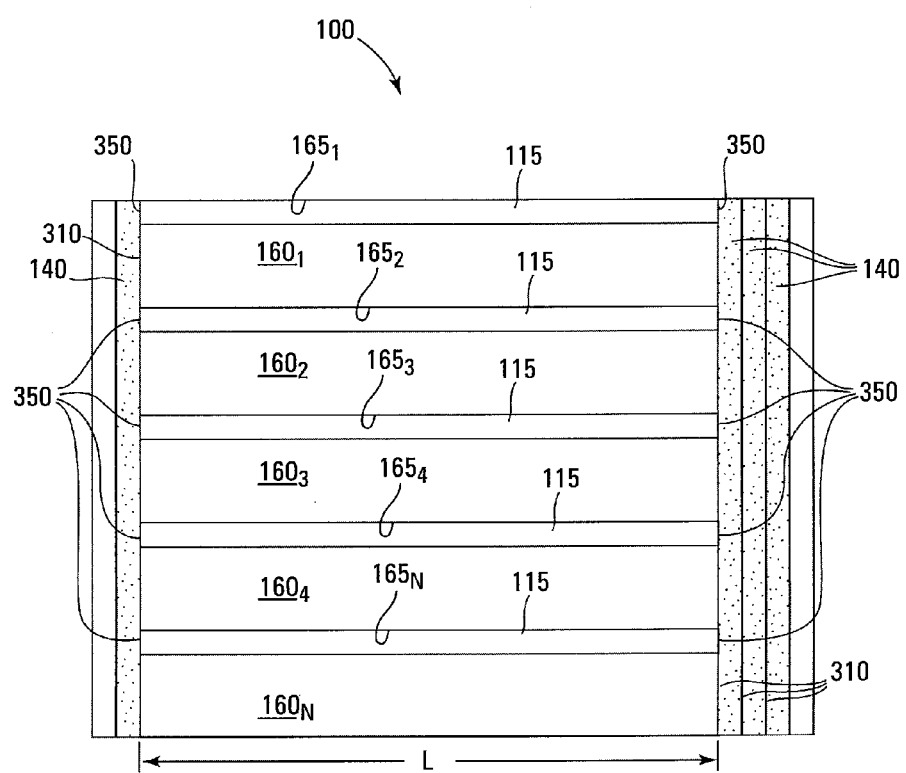
FIG. 3B is a top view of a portion of the fluid-ejection device at the stage of fabrication shown in FIG. 1C, according to another embodiment of the disclosure.

For one embodiment, the piezoelectric material 140 at the bottom of each of slots 310, the portion of conductive coating 145 underlying the piezoelectric material 140 at the bottom of each of slots 310, and the portion of adhesive 130 underlying that portion of conductive coating 145, is not removed, as indicated by the presence of the stippled portions within slots 310 in FIG. 3B. Leaving the piezoelectric material 140 at the bottom of each of slots 310, the portion of conductive coating 145 underlying the piezoelectric material 140 at the bottom of each of slots 310, and the portion of adhesive 130 underlying that portion of conductive coating 145 leaves the lower conductor 180 of each actuator 160 electrically coupled to the lower conductors 180 of remaining actuators 160 adjacent either end 350 of each of slots 160.

As discussed above in conjunction with FIG. 2, portions, e.g., valleys 250, of conductive coating 145, and thus of one or more of conductors 180 formed from conductive coating 145, contact conductive layer 125. For one embodiment, contact between the valleys 250 of the one or more of conductors 180 and ground layer 125 electrically couples the conductor 180 of each actuator 160 to ground layer 125 in that conductors 180 of the respective actuators 160 are coupled to each other. For another embodiment, contact between the valleys 250 of the lower conductor 182 of ground electrode 170 electrically couple conductor 182 to ground layer 125 so that lower conductor 182 and upper conductor 172 are electrically shorted. This means that all of the lower conductors 180 of actuators 160 can be coupled to ground simultaneously by coupling ground electrode 170 to ground.

Figure 4A:
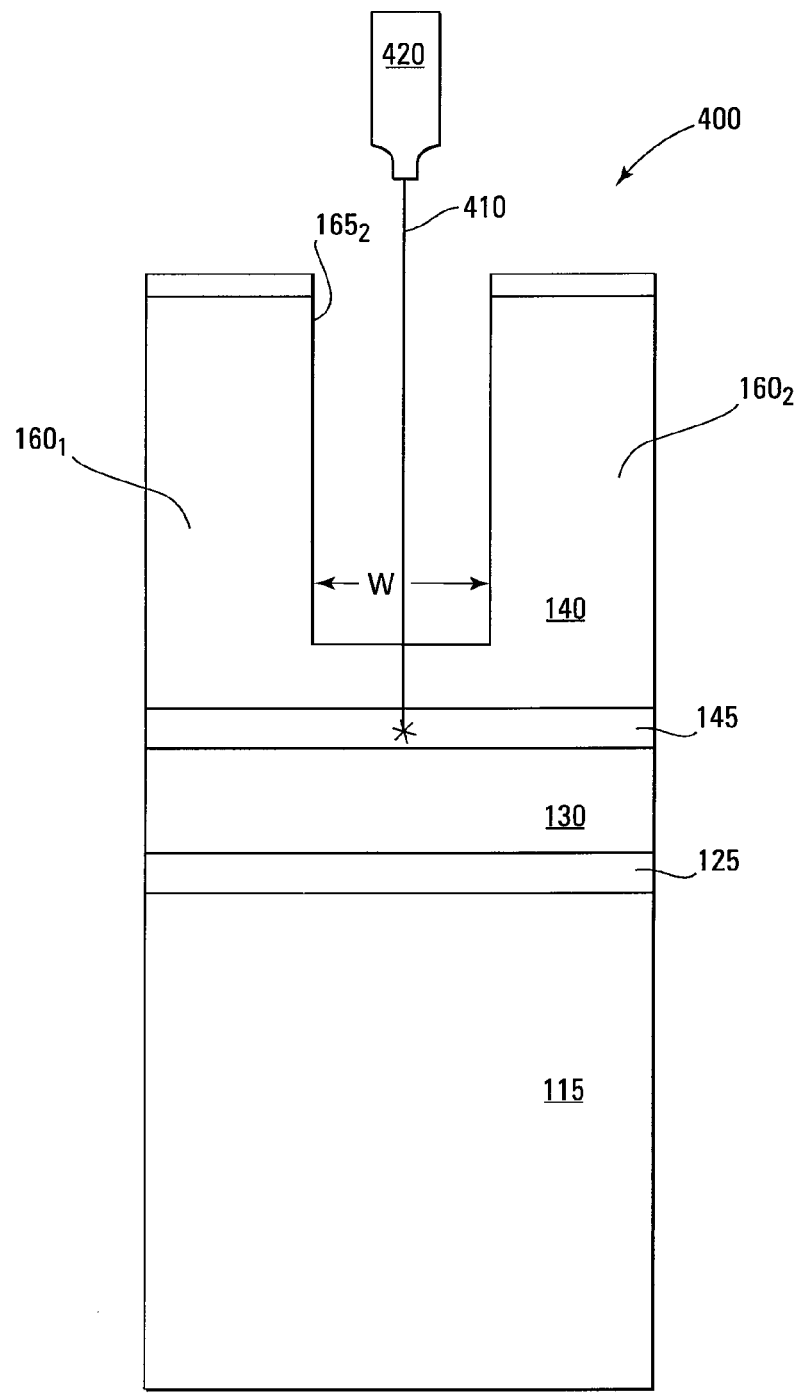
FIGS. 4A-4D illustrate region 400 of FIG. 1B at different stages fabrication, according to another embodiment of the disclosure.

FIGS. 4A-4D illustrate region 400 of FIG. 1B at different stages of extending slot $165_2$ to expose a portion of the upper surface of glass layer 115. In FIG. 4A, a beam of electromagnetic radiation 410, such as a laser beam, from a radiation source 420, such as a laser, e.g., a pulsed-laser, is directed into slot $165_2$. The wavelength of electromagnetic radiation 410 is such that electromagnetic radiation 410 is transmitted through the piezoelectric material 140 at the bottom of slot $165_2$ that is connected between neighboring piezoelectric actuators $160_1$ and $160_2$. For example, for one embodiment, the wavelength of electromagnetic radiation 410 is about 500 to about 5000 nanometers. For another embodiment, the wavelength of electromagnetic radiation 410 is about 1064 nanometers.

Figure 4B:
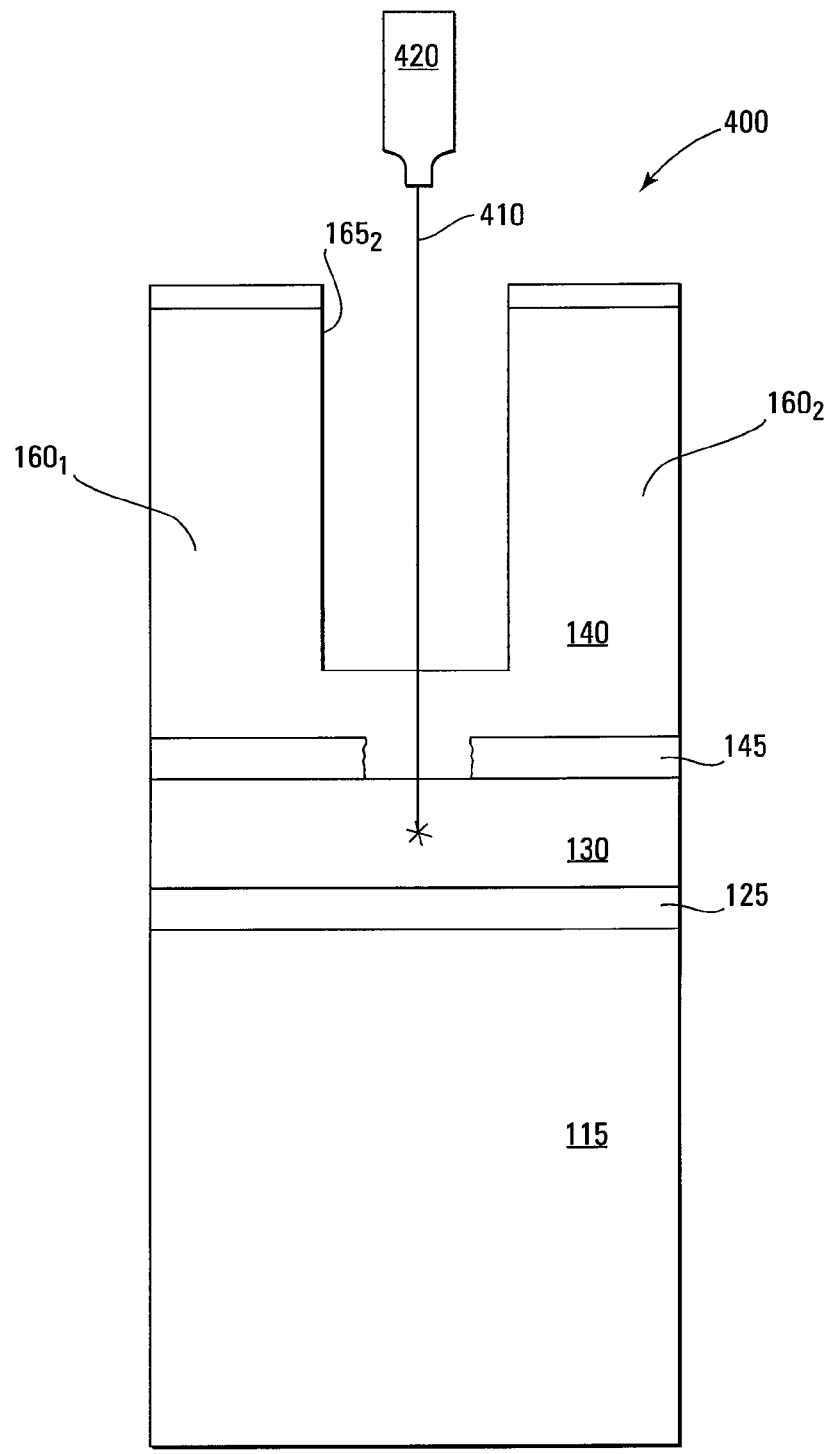

After electromagnetic radiation 410 is transmitted through piezoelectric material 140, electromagnetic radiation 410 is absorbed by conductive coating 145, as shown in FIG. 4A. The absorbed electromagnetic radiation 410 ablates, e.g., vaporizes, the material of conductive coating 145, as shown in FIG. 4B.

Figure 4C:
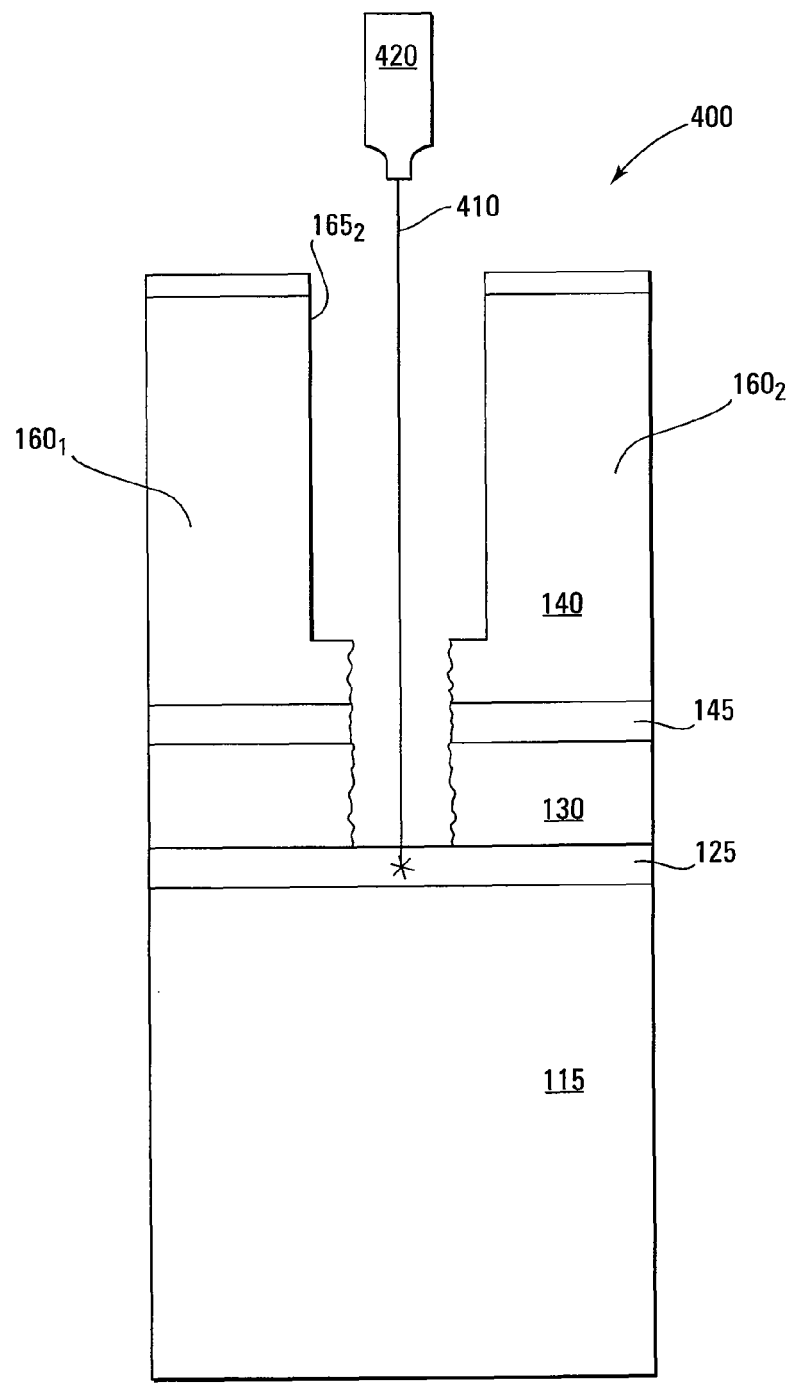
Figure 4D:
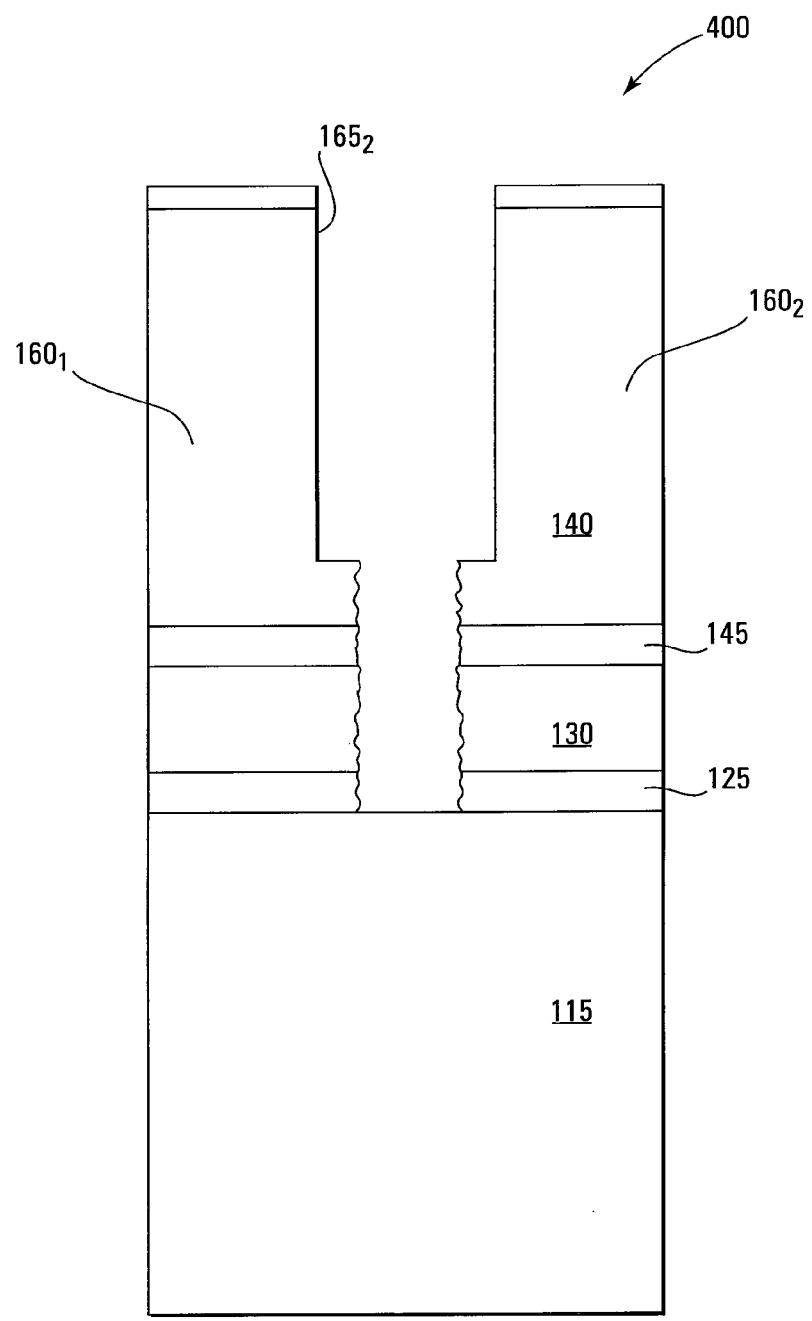

Electromagnetic radiation 410 is subsequently absorbed by adhesive 130. The absorbed electromagnetic radiation 410 ablates, e.g., vaporizes, adhesive 130. Ablation of adhesive 130 generates forces that act to remove the piezoelectric material 140 at the bottom of slot $165_2$. For example, the forces act to breakup and dislodge the piezoelectric material 140. For one embodiment, ablation of the material of conductive coating 145 and adhesive 130 may occur substantially concurrently, and forces generated by the substantially concurrent ablation of the material of conductive coating 145 and adhesive 130 act to remove the piezoelectric material 140 at the bottom of slot $165_2$. Electromagnetic radiation 410 may be subsequently absorbed by ground layer 125, as shown in FIG. 4C. The absorbed electromagnetic radiation 410 ablates, e.g., vaporizes, the material of ground layer 125, as shown in FIG. 4D. For another embodiment, ablation of adhesive 130 and ground layer 125 may occur substantially concurrently, and forces generated by the substantially concurrent ablation of the material of adhesive 130 and ground layer 125 act to remove the piezoelectric material 140 at the bottom of slot $165_2$. For a further embodiment, ablation of the material of conductive coating 145, adhesive 130, and ground layer 125, may occur substantially concurrently, and forces generated by the substantially concurrent ablation of the material of conductive coating 145, adhesive 130, and ground layer 125 act to remove the piezoelectric material 140 at the bottom of slot $165_2$. Any remaining loose piezoelectric material 140 may be subsequently removed in a cleaning step, e.g., by a mechanical scrubber, spin-rinse dryer, etc. so that there is no piezoelectric material 140 mechanically and electrically coupling neighboring actuators $160_1$ and $160_2$ across slot $165_2$, as shown in FIG. 4D. Note that sidewalls of neighboring actuators $160_1$ and $160_2$ form opposing sidewalls of slot $165_2$ and thus for one embodiment neighboring actuators across a slot refers to actuators whose sidewalls form opposing sidewalls of that slot.

Note that conductive coating 145, adhesive 130, and ground layer 125 directly underlying at least a portion of each slot 165 are removed by the ablation thereof, as shown for slot $165_2$ in FIG. 4D. Therefore, there is a discontinuity in the piezoelectric material 140 across each slot 165, e.g., slot $165_2$, so that there is no piezoelectric material 140 mechanically and electrically coupling neighboring actuators, such as $160_1$ and $160_2$, across each slot 165. For example, each slot 165 is devoid of piezoelectric material 140 electrically and mechanically coupling neighboring actuators 160 across that slot and, for example, an actuator 160 and ground electrode 170 across slot $165_1$. Note that conductive coating 145, adhesive 130, and ground layer 125 are also discontinuous below each slot 165, so that each slot 160 exposes a portion of an upper surface of glass layer 115, e.g., over the length L (FIG. 3A) of that slot 165 and over at least a portion of the width W (FIG. 4A) of that slot. That is, there is no material of conductive coating 145, adhesive 130, and ground layer 125 mechanically and/or electrically coupling neighboring actuators 160 across a slot 165, as shown in FIG. 4D for neighboring actuators $160_1$ and $160_2$ and slot $160_2$, or across slot $165_1$ between actuator $160_1$ and electrode 170. For example, each slot 165 is devoid of material of conductive coating 145, adhesive 130, and ground layer 125 mechanically and/or electrically coupling neighboring actuators 160 across that slot and between an electrode 170 and an actuator 160 across slot $165_1$.

To remove the material of conductive coating 145, adhesive 130, ground layer 125, and piezoelectric material 140 from each of the slots 165, the beam of electromagnetic radiation 410 scans at least a portion of the width W and the length L of each slot 165. Scanning each slot 165 effects the above removal process of ablating the material of conductive coating 145, adhesive 130, and ground layer 125 using electromagnetic radiation 410 and removal of the piezoelectric material 140 by the forces generated by the ablation of adhesive 130 or by the ablation of adhesive 130 and the material of conductive coating 145, by the ablation of adhesive 130 and the material of ground layer 125, or by the ablation of adhesive 130, the material of conductive coating 145, and the material of ground layer 125.

For one embodiment, glass layer 115 forms a deflectable-layer, such as a pump-layer, of the print-head 100 of FIG. 1C, that can be locally deflected (e.g., flexed) in response to applying electric fields to actuators 160. For example, during operation of print-head 100, for one embodiment, an electric field may be selectively applied an actuator 160, e.g., actuator $160_1$, by selectively applying a voltage to the upper conductor 162, e.g., upper conductor $162_1$, of that actuator 160 while grounding the lower conductor, e.g., lower conductor $180_1$, via ground plane 125 and ground electrode 170.

The applied electric field causes actuator $160_1$ to expand and to exert a local force on a portion 190, denoted by dashed lines in FIG. 1C, of glass layer 115 directly aligned with and overlying channel $120_1$. The local force acts to flex portion 190 of glass layer 115. Flexing portion 190 causes fluid, such as ink, e.g., in the form of a drop, to be ejected from channel $120_1$. Similarly, fluid may be selectively ejected from each channel 120 by selectively applying an electric field to the actuator 160 directly aligned with and overlying that channel 120.

An advantage of removing the piezoelectric material 140 from slots 165 so that there is no piezoelectric material 140 electrically and mechanically coupling neighboring actuators 160 on either side of the slots 165, as shown in FIG. 1D, and between an electrode 170 and an actuator 160, as shown in FIG. 1C, is the reduction of cross-talk between the actuators 160, compared to when piezoelectric material 140 left at the bottom of slots 165 electrically and mechanically couples neighboring actuators 160 on either side of the slots 165, as shown in FIG. 1B. Cross-talk can adversely affect print quality, and, therefore, reducing cross-talk by removing the piezoelectric material 140 from slots 165 acts improve print quality compared to when piezoelectric material 140 is left at the bottom of slots 165.

Extending at least a portion of slots 165 to glass layer 115 to expose an upper surface of glass layer 115 so that there is no material of conductive coating 145, adhesive 130, and ground layer 125 and no piezoelectric material 140 mechanically coupling neighboring actuators 160 across each slot 165, as shown in FIG. 1D for slot $165_2$ and neighboring actuators $160_1$ and $160_2$, acts to increase the compliance of glass layer 115 relative to when there is material of conductive coating 145, adhesive 130, and ground layer 125 and piezoelectric material 140 mechanically coupling neighboring actuators 160 across each slot 165. For example the mechanical coupling of neighboring actuators 160 across each slot 165 by the material of conductive coating 145, adhesive 130, and ground layer 125 and piezoelectric material 140 acts to reinforce and thereby decreases the compliance of glass layer 115. The increased compliance of glass layer 115, effected by removing piezoelectric material 140, the material of conductive coating 145, and adhesive 130 from slots 165, acts to decrease the strength of the electric field that needs to be applied to actuators 160 in order to produce certain drop velocities from the corresponding channels 120. Decreasing the strength of the electric field applied to actuators 160 acts to decrease electric-field induced degradation of the piezoelectric material 140 of actuators 140.

CONCLUSION

Although specific embodiments have been illustrated and described herein it is manifestly intended that the scope of the claimed subject matter be limited only by the following claims and equivalents thereof.

What is claimed is:

1. A method of forming a fluid-ejection device, comprising:
   forming a pump-layer overlying a substrate, the substrate having at least one fluid-delivery channel formed therein;
   forming a conductive layer overlying the pump-layer;
   bonding a layer of piezoelectric material to the conductive layer;
   using a mechanical cutting tool to form at least one slot in the layer of piezoelectric material, the at least one slot forming first and second portions of the layer of piezoelectric material on either side of the at least one slot, wherein each of the at least one slot has a bottom surface that terminates within the layer of piezoelectric material such that the at least one slot does not extend completely through the layer of piezoelectric material along a direction of thickness of the layer and so that a third portion of the layer of piezoelectric material within the at least one slot extends between the first and second portions of the layer of piezoelectric material, wherein each of at least one of the first and second portions of the layer of piezoelectric material forms a piezoelectric actuator above and directly aligned with a respective one of the at least one fluid-delivery channel in that a width of the respective one of the at least one fluid-delivery channel and a width of the piezoelectric actuator have a common center axis;
   directing electromagnetic radiation into the at least one slot;
   transmitting the electromagnetic radiation through the third portion of the layer of piezoelectric material; and
   absorbing the electromagnetic radiation in at least an adhesive that bonds the layer of piezoelectric material to the conductive layer;
   wherein absorbing the electromagnetic radiation in at least the adhesive ablates the adhesive and the ablation of the adhesive acts to remove at least a portion of the third portion of the layer of piezoelectric material from the at least one slot.

2. The method of claim 1, further comprising:
   absorbing the electromagnetic radiation in a conductive coating formed on a lower surface of the layer of piezoelectric material, wherein absorbing the electromagnetic radiation in the conductive coating ablates the conductive coating; and
   absorbing the electromagnetic radiation in the conductive layer, wherein absorbing the electromagnetic radiation in the conductive layer ablates the conductive layer.

3. The method of claim 2, wherein the ablation of the adhesive, the conductive coating, and the conductive layer, occurs substantially concurrently and wherein the substantially concurrent ablation of the adhesive, the conductive coating, and the conductive layer acts to remove the at least the portion of the third portion of the layer of piezoelectric material from the at least one slot.

4. The method of claim 2, wherein the ablation of the adhesive, the conductive coating, and the conductive layer and the removal of the at least the portion of the third portion of the layer of piezoelectric material from the at least one slot exposes an upper surface of the pump-layer.

5. The method of claim 1, further comprising forming an other conductive layer overlying the layer of piezoelectric material before forming the at least one slot.

6. The method of claim 5, further comprising forming the at least one slot through the other conductive layer to form first and second portions of the other conductive layer that respectively overlie the first and second portions of the layer of piezoelectric material.

7. The method of claim 1, wherein the electromagnetic radiation has a wavelength of about 500 to about 5000 nanometers.

* * * * *